United States Patent
Finkikoglu et al.

(10) Patent No.: US 7,601,430 B2
(45) Date of Patent: Oct. 13, 2009

(54) BIAXIALLY ORIENTED FILM ON FLEXIBLE POLYMERIC SUBSTRATE

(75) Inventors: Alp T. Finkikoglu, Los Alamos, NM (US); Vladimir Matias, Santa Fe, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 359 days.

(21) Appl. No.: 11/345,106

(22) Filed: Jan. 31, 2006

(65) Prior Publication Data

US 2009/0214859 A1 Aug. 27, 2009

(51) Int. Cl.
*B32B 27/00* (2006.01)
*B32B 27/28* (2006.01)
*B32B 9/00* (2006.01)

(52) U.S. Cl. .................... 428/473.5; 428/688; 428/689; 428/699; 428/701; 428/702

(58) Field of Classification Search ................. 428/458, 428/473.5, 688, 689, 699, 701, 702
See application file for complete search history.

(56) References Cited

U.S. PATENT DOCUMENTS

| | | | | |
|---|---|---|---|---|
| 5,432,151 | A | * | 7/1995 | Russo et al. ................. 505/474 |
| 5,449,659 | A | * | 9/1995 | Garrison et al. ............. 505/330 |
| 5,523,587 | A | * | 6/1996 | Kwo ........................... 257/64 |
| 5,650,378 | A | | 7/1997 | Iijima et al. |
| 5,772,755 | A | * | 6/1998 | Hegenbarth et al. ........... 117/68 |
| 5,872,080 | A | | 2/1999 | Arendt et al. |
| 6,872,988 | B1 | * | 3/2005 | Goyal .......................... 257/190 |
| 2002/0073918 | A1 | * | 6/2002 | Reade et al. ................... 117/84 |
| 2003/0036483 | A1 | * | 2/2003 | Arendt et al. ................ 505/239 |
| 2004/0028954 | A1 | * | 2/2004 | Arendt et al. ................ 428/701 |
| 2006/0099778 | A1 | * | 5/2006 | Kwon et al. ................. 438/482 |
| 2006/0208257 | A1 | * | 9/2006 | Branz et al. .................... 257/49 |
| 2007/0114124 | A1 | * | 5/2007 | Hoffbauer et al. ...... 204/192.12 |

FOREIGN PATENT DOCUMENTS

EP 631297 A2 * 12/1994
WO WO 01/70005 A2 * 9/2001

OTHER PUBLICATIONS

Wang et al., "High Energy Xenon Ion Beam Assisted Deposition of TiN Film and its Industrial Application," J. of Mat. Sci., vol. 31, pp. 363-369, (1996).

* cited by examiner

*Primary Examiner*—Callie E Shosho
*Assistant Examiner*—John Freeman
(74) *Attorney, Agent, or Firm*—Robert P. Santandrea; Juliet A. Jones

(57) ABSTRACT

A flexible polymer-based template having a biaxially oriented film grown on the surface of a polymeric substrate. The template having the biaxially oriented film can be used for further epitaxial growth of films of interest for applications such as photovoltaic cells, light emitting diodes, and the like. Methods of forming such a flexible template and providing the polymeric substrate with a biaxially oriented film deposited thereon are also described.

24 Claims, 3 Drawing Sheets

US 7,601,430 B2

BIAXIALLY ORIENTED FILM ON FLEXIBLE POLYMERIC SUBSTRATE

STATEMENT REGARDING FEDERAL RIGHTS

This invention was made with government support under Contract No. W-7405-ENG-36, awarded by the U.S. Department of Energy. The government has certain rights in the invention.

BACKGROUND OF INVENTION

The invention relates to templates for films used in electronic device applications such as photovoltaic cells, light emitting diodes, and the like. More particularly, the invention relates to flexible templates for such films.

Many thin-film oxide and semiconductor sensor and device applications depend on the presence of a suitable epitaxial template for the growth of thin films having a high degree of crystallographic orientation. Single crystal templates that are used in conventional epitaxial growth techniques are limited to select materials.

Polymer-based substrates are of particular interest for use in applications such as flexible electronics, sensors, solar cells, and displays. However, devices that use such polymer-based substrates suffer from poor performance due to the fact that the oxide, nitride, or semiconductor films deposited on the substrate are either amorphous or polycrystalline.

The use of either amorphous or polycrystalline films on polymer-based templates results in non-optimal electrical/optical/mechanical properties. Therefore, what is needed is a flexible polymer-based template having a biaxially oriented surface. What is also needed is a method of making such templates.

SUMMARY OF INVENTION

The present invention meets these and other needs by providing a flexible polymer-based substrate having a biaxially oriented film grown on the surface of the polymer. Methods of forming such a substrate and providing the polymeric substrate with a biaxially oriented film are also described. The template having the biaxially oriented film can be used for further epitaxial growth of films of interest for applications such as photovoltaic cells, light emitting diodes, and the like.

Accordingly, one aspect of the invention is to provide a flexible template for a device. The flexible template comprises: a flexible polymeric substrate; a biaxially oriented intermediate layer disposed over the flexible polymeric substrate; and a biaxially oriented buffer layer epitaxially grown on the intermediate layer.

A second aspect of the invention is to provide a flexible template. The flexible template comprises: a flexible polymeric substrate, wherein the flexible polymeric substrate comprises a polymer selected from the group consisting of polyimides, polyetheretherketones, polyethersulfones, nylons, fluoropolymers, polyamides, polyethylene terephthalates, polyethylene naphthalates, polypropylene, and combinations thereof; a biaxially oriented intermediate layer disposed over the flexible polymeric substrate, wherein the intermediate layer is deposited by ion beam assisted deposition and has a face-centered cubic-based structure, and wherein the intermediate layer is one of a nitride and an oxide; and a biaxially oriented buffer layer epitaxially grown on the intermediate layer.

A third aspect of the invention is to provide a flexible template. The flexible template comprises: a flexible polymeric substrate, wherein the flexible polymeric substrate comprises a polymer selected from the group consisting of polyimides, polyetheretherketones, polyethersulfones, nylons, fluoropolymers, polyamides, polyethylene terephthalates, polyethylene naphthalates, polypropylene, and combinations thereof; a nucleation layer disposed on a surface of the polyimide base; a biaxially oriented intermediate layer disposed on the nucleation layer, wherein the intermediate layer is deposited by ion beam assisted deposition and has a face-centered cubic-based crystal structure, and wherein the intermediate layer is one of a nitride and an oxide; and a biaxially oriented buffer layer epitaxially grown on the intermediate layer.

A fourth aspect of the invention is to provide a method of making a flexible template, wherein the substrate comprises a flexible polymeric substrate, a biaxially oriented intermediate layer disposed over the flexible polymeric substrate, and a biaxially oriented buffer layer epitaxially grown on the intermediate layer. The method comprises the steps of: providing the flexible polymeric substrate; depositing the biaxially oriented intermediate layer over the flexible polymeric substrate by ion beam assisted deposition; and epitaxially depositing the biaxially oriented buffer layer on the biaxially oriented intermediate layer to form the flexible template.

A fifth aspect of the invention is to provide a method of providing a biaxially oriented crystal surface to a flexible polymeric substrate. The method comprises the steps of: providing the flexible polymeric substrate; depositing a biaxially oriented intermediate layer over the flexible polymeric substrate by ion beam assisted deposition; and depositing a biaxially oriented buffer layer on the biaxially oriented intermediate layer to form the flexible template.

These and other aspects, advantages, and salient features of the present invention will become apparent from the following detailed description, the accompanying drawings, and the appended claims.

DETAILED DESCRIPTION

Figure 1:
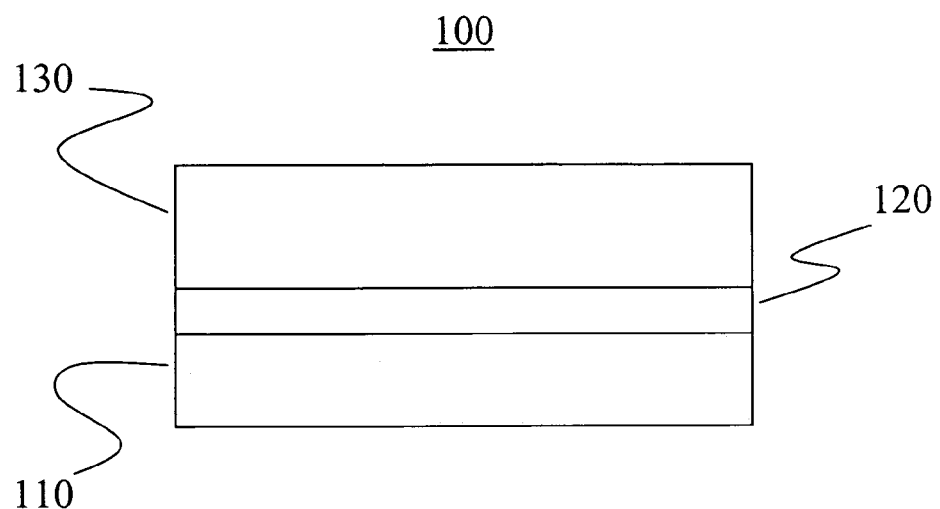
FIG. 1 is a schematic representation of a flexible template.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing a particular embodiment of the invention and are not intended to limit the invention thereto. Turning to FIG. 1, a flexible template of the present invention is shown. Flexible template 100 permits the subsequent growth of epitaxial layers thereupon. Flexible template 100 includes a flexible polymeric substrate 110, a biaxially oriented intermediate layer 120 disposed over flexible polymeric substrate 110, and a biaxially oriented buffer layer 130 epitaxially deposited on intermediate layer biaxially oriented intermediate layer 120. In a second embodiment, shown in FIG. 2, substrate 200 comprises flexible polymeric substrate 110, biaxially oriented intermediate layer 120, and biaxially oriented buffer layer 130 as described above, and further includes a nucleation layer 140 disposed between flexible polymeric substrate 110 and biaxially oriented intermediate layer 120.

Flexible polymeric substrate serves as a flexible base upon which subsequent layers may be deposited. In one embodiment, flexible polymeric substrate 110 comprises a polyimide such as, for example, Kapton® or Upilex®. Alternatively, flexible polymeric substrate 110 may comprise other polymeric materials such as, but not limited to, polyetheretherketones (PEEK), such as Ketron®; polyethersulfones, such as Supradel®; nylons, such as Zytel®; fluoropolymers, such as Teflon®; polyimide/fluoropolymer composites, such as Oasis®; polyamides; polyethylene terephthalate (PET); polyethylene naphthalates, such as Kaladex®; polypropylene films; and the like. A number of these polymers are stable up to temperatures above about 200° C. Polyetheretherketones, for example, are stable up to about 300° C., whereas some polyethersulfones and nylons are stable up to temperatures in a range from about 250° C. to about 265° C. Flexible polymeric substrate 110 has a thickness in a range from about 5 microns to about 500 microns.

As used herein, an "epitaxial" or "epitaxially deposited" layer is a layer in which the biaxial orientation or crystallographic texture of the underlying "host" material (e.g., a template or buffer layer) onto which the layer is grown defines a corresponding biaxial orientation or crystallographic texture in the layer. The underlying material and the epitaxially deposited layer need not have the same crystal structure. As used herein, the terms "biaxially oriented" and "biaxial orientation" refer to a surface or layer in which the crystal grains are in close alignment both in the plane and out of the plane (i.e., perpendicular to the plane) of the surface of the layer. One type of biaxially oriented surface is a cubic textured surface in which the crystal grains are in close alignment with directions both parallel and perpendicular to the surface.

Biaxially oriented intermediate layer 120 establishes a crystallographic template upon which successive layers of material having the same or similar crystallographic orientation or texture may be deposited. In one embodiment, biaxially oriented intermediate layer 120 comprises at least one of an oxide and a nitride. The oxide has a face-centered cubic-based crystal structure (such as, for example, a rock salt structure) and may be a binary metal oxide. Non-limiting examples of such binary metal oxides include magnesium oxide, calcium oxide, strontium oxide, barium oxide, titanium oxide, zirconium oxide, vanadium oxide, niobium oxide, tantalum oxide, chromium oxide, manganese oxide, iron oxide, cobalt oxide, nickel oxide, cadmium oxide, scandium oxide, lanthanum oxide, cerium oxide, neodymium oxide, samarium oxide, europium oxide, ytterbium oxide, combinations thereof, and the like. In one particular embodiment, the biaxially oriented intermediate layer comprises magnesium oxide.

The nitride also has a face-centered cubic-based crystal structure, and may be one of strontium nitride, scandium nitride, yttrium nitride, titanium nitride, zirconium nitride, hafnium nitride, vanadium nitride, niobium nitride, tantalum nitride, chromium nitride, molybdenum nitride, tungsten nitride, lanthanum nitride, cerium nitride, praseodymium nitride, neodymium nitride, samarium nitride, europium nitride, gadolinium nitride, terbium nitride, dysprosium nitride, holmium nitride, erbium nitride, ytterbium nitride, lutetium nitride, thulium nitride, and combinations thereof. In one particular embodiment, the nitride is titanium nitride. Biaxially oriented intermediate layer 120 has a thickness in a range from about 2 nm to about 50 nm.

In one embodiment, biaxially oriented intermediate layer 120 comprises an oxide as described hereinabove, and is deposited on either flexible polymeric substrate 110 or nucleation layer 140 using ion beam assisted deposition (also referred to herein as "IBAD"), which also includes reactive ion beam assisted deposition (also referred to herein as "RIBAD"). IBAD is a low temperature deposition process that has been widely used in the preparation of templates for high temperature superconducting films in coated conductors. IBAD texturing can produce nearly single-crystalline films with crystallographic properties approaching those of conventional epitaxial thin films by using an off-normal ion beam to establish a preferred orientation for film growth on a non-single-crystalline (i.e., amorphous or polycrystalline) substrate. Once established, the IBAD layer serves as a biaxially oriented template for the epitaxial growth of subsequent layers. The principles of IBAD are described in U.S. Pat. No. 5,650,378 by Yauhiro Iijima et al., entitled "Method of making Polycrystalline Thin Film and Superconducting Body," and issued on Jul. 22, 1997, and U.S. Pat. No. 5,872,080 by Paul N. Arendt et al., entitled "High Temperature Superconducting Thick Films, issued Feb. 16, 1999. The contents of U.S. Pat. Nos. 5,650,378 and 5,872,080 are incorporated herein by reference in their entirety.

In another embodiment, biaxially oriented intermediate layer 120 comprises a nitride as described hereinabove, and is deposited on either flexible polymeric substrate 110 or nucleation layer 140 using IBAD or RIBAD. During deposition by RIBAD, the nitride is formed by providing the metal constituent of the nitride to either flexible polymeric substrate 110 or nucleation layer 140. The metal constituent may provided by either physical vapor deposition or chemical vapor deposition, while directing a beam comprising $Ar^+$ and $N^+$ ions at either flexible polymeric substrate 110 or nucleation layer 140 at a predetermined angle (usually about 45°) from an axis normal to either flexible polymeric substrate 110 or nucleation layer 140.

Biaxially oriented buffer layer 130 is epitaxially deposited on intermediate layer 120 and is biaxially oriented with respect to intermediate layer 120. Biaxially oriented buffer layer 130 extends the crystalline order established by intermediate layer 120 and serves to achieve a desired combined thickness of biaxially oriented intermediate layer 120 and buffer layer 130. In addition, biaxially oriented buffer layer 130 provides a diffusion barrier between flexible polymeric substrate 110 and any additional layers that may be deposited over buffer layer 130.

Like biaxially oriented intermediate layer 120, biaxially oriented buffer layer 130 comprises at least one of an oxide and a nitride having a cubic-based crystal structure (for example, a simple cubic, face-centered cubic, body-centered cubic, or rock salt structure). In one embodiment, the oxide or nitride has a rock salt crystal structure.

The oxide may be a binary oxide such as, but not limited to, magnesium oxide, calcium oxide, strontium oxide, barium oxide, titanium oxide, zirconium oxide, vanadium oxide, niobium oxide, tantalum oxide, chromium oxide, manganese oxide, iron oxide, cobalt oxide, nickel oxide, cadmium oxide, scandium oxide, lanthanum oxide, cerium oxide, neodymium oxide, samarium oxide, europium oxide, ytterbium oxide, and combinations thereof. In one particular embodiment, the biaxially oriented intermediate layer comprises magnesium oxide.

The nitride also has a cubic-based crystal structure, and may be one of strontium nitride, scandium nitride, yttrium nitride, titanium nitride, zirconium nitride, hafnium nitride, vanadium nitride, niobium nitride, tantalum nitride, chromium nitride, molybdenum nitride, tungsten nitride, lanthanum nitride, cerium nitride, praseodymium nitride, neodymium nitride, samarium nitride, europium nitride, gadolinium nitride, terbium nitride, dysprosium nitride, holmium nitride, erbium nitride, ytterbium nitride, lutetium nitride, thulium nitride, and combinations thereof. In one particular embodiment, the nitride is titanium nitride. Biaxially oriented buffer layer 130 has a thickness in a range from about 50 nm to about 500 nm. Biaxially oriented buffer layer 130 may be formed by various deposition methods known in the art, such as sputtering (including reactive sputtering), electron beam evaporation, metal-organic deposition, metal-organic chemical vapor deposition, chemical vapor deposition, polymer assisted deposition, laser ablation, and the like.

Biaxially oriented intermediate layer 120 and buffer layer 130 may comprise the same material, in which case buffer layer 130 is homoepitaxially deposited on intermediate layer 120. For example, in one embodiment, both layers comprise magnesium oxide (MgO). Alternatively, biaxially oriented intermediate layer 120 and buffer layer 130 may comprise different materials.

Figure 2:
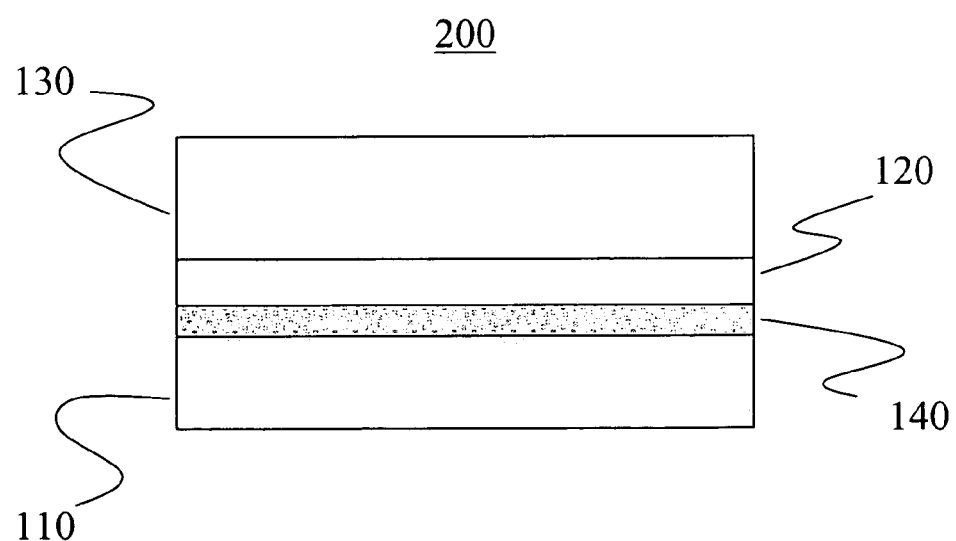
FIG. 2 is a schematic representation of a second template.

In one embodiment, shown in FIG. 2, a nucleation layer 140 is disposed on flexible polymeric substrate 110 such that nucleation layer 140 is disposed between flexible polymeric substrate 110 and biaxially oriented intermediate layer 120. Nucleation layer 140 enables texturing of the IBAD-deposited biaxially oriented intermediate layer 120. Nucleation layer 140 comprises, in one embodiment, an oxide such as, but not limited to, yttrium oxide ($Y_2O_3$) or the like. Alternatively, nucleation layer 140 may comprise a nitride. For example, amorphous $Si_3N_4$ has been used as a nucleation layer for IBAD-deposited MgO. Nucleation layer 140 may be deposited by electronic beam (e-beam) evaporation, and has a thickness in a range from about 1 nm to about 20 nm. Other methods known in the art, such as sol-gel methods, chemical vapor deposition (CVD), sputtering and other physical vapor deposition (PVD) methods, and the like may be used as well.

If the material comprising biaxially oriented buffer layer 130 is required in a particular application (for example, MgO is required for optical applications), flexible template 100 may be used directly. Alternatively, at least one active layer may be deposited on or over biaxially oriented buffer layer 130 to adapt flexible template 100 to selected applications. If, for example, additional epitaxial films, such as ferroelectrics (e.g., $Sr_{1-x}Ba_xTiO_3$) are needed for memory or other electronics applications, such films may be grown hetero-epitaxially on or over biaxially oriented buffer layer 130 using low temperature processes such as sol-gel techniques and the like. Flexible template 100 may also be used in other applications such as, but not limited to, sensors, photovoltaic cells, light emitting diodes (LEDs), and transistors, that include at least one semiconducting active layer. To preserve the integrity of the flexible polymeric substrate, such semiconducting active layers must be deposited at sufficiently low temperatures. Subsequent layers on Kapton® and Upilex®, for example, should be deposited at temperature of less than about 450° C. For other materials, even lower deposition temperatures should be used.

Figure 3:
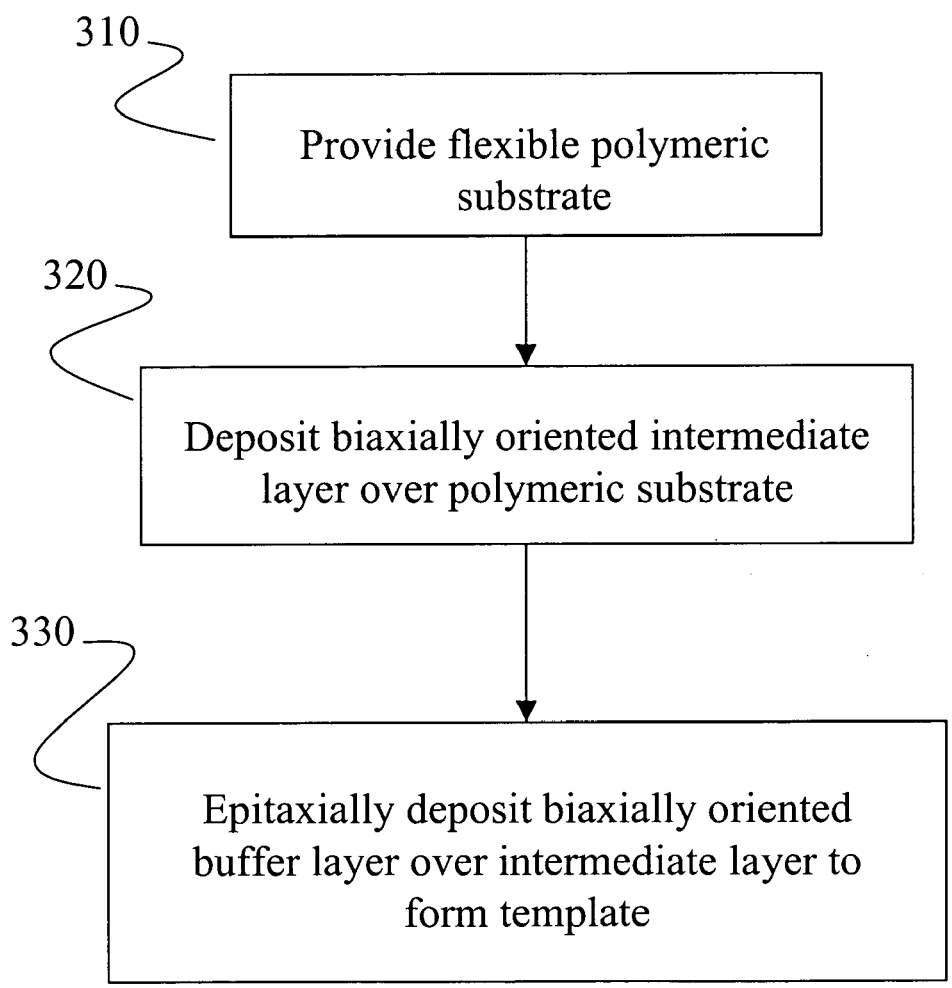
FIG. 3 is a flow chart for a method of making a flexible template.

A method of making flexible templates 100, 200 described herein is also provided. A flow chart for method 300 is shown in FIG. 3. The materials and methods of depositing individual layers that comprise flexible templates 100, 200, have been previously described herein. In Step 310, a flexible polymeric substrate 110 is provided. In step 320, a biaxially oriented intermediate layer 120 is then deposited over flexible polymeric substrate 110. In one embodiment, nucleation layer 140 is deposited on flexible polymeric substrate 110 prior to deposition of intermediate layer 120. Finally, in step 330, a biaxially oriented buffer layer 130 is epitaxially deposited on intermediate layer 120 to form flexible template 100, 200.

Figure 4:
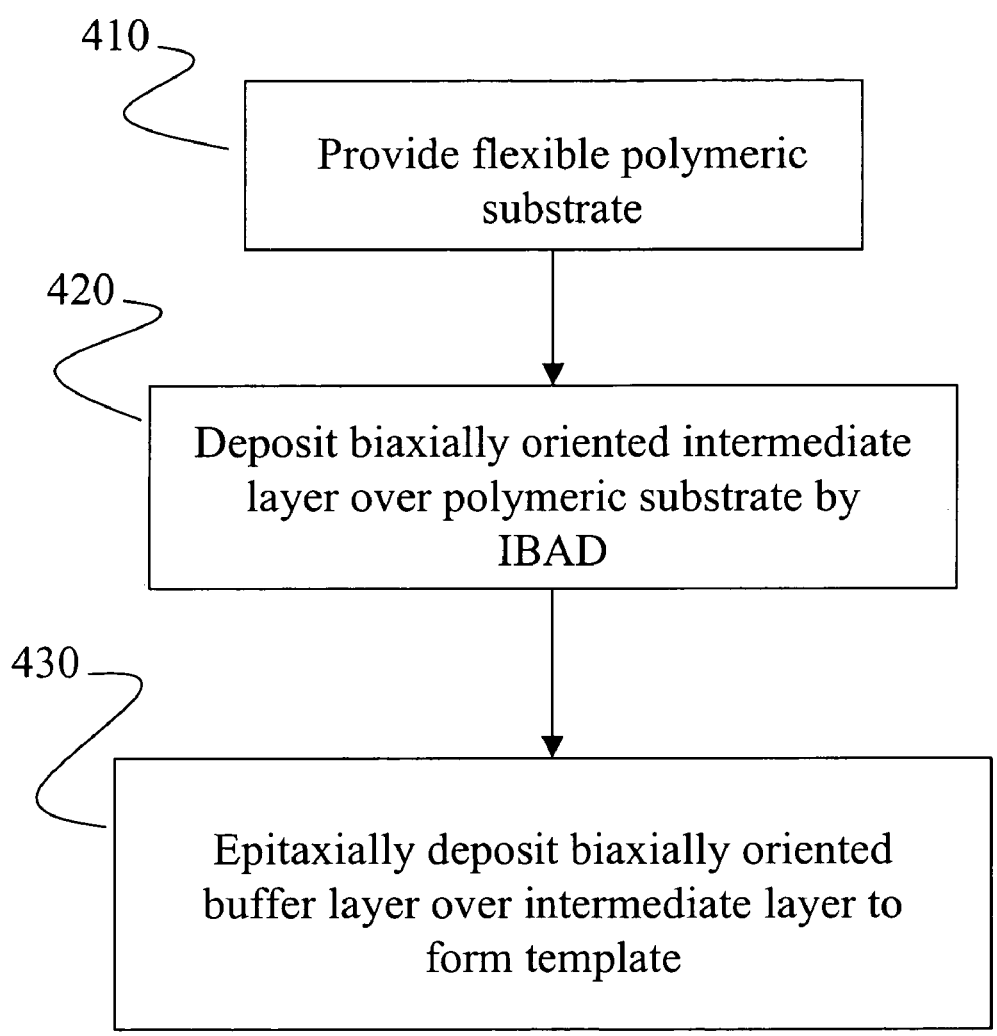
FIG. 4 is a flow chart for a method of providing a biaxially oriented crystal surface to a flexible polymeric substrate.

The invention also provides a method of providing a biaxially oriented crystal surface to a flexible polymeric substrate. A flow chart for method 400 is shown in FIG. 4. In Step 410, a flexible polymeric substrate 110 is first provided. A biaxially oriented intermediate layer 120 is then deposited over flexible polymeric substrate 110 by ion beam assisted deposition (Step 420). Biaxially oriented buffer layer 130 is then epitaxially deposited on intermediate layer 120 to from the biaxially oriented crystal surface (Step 430). In one embodiment, nucleation layer 140 is deposited on flexible polymeric substrate 110 prior to deposition of intermediate layer 120. Materials comprising flexible polymeric substrate 110, biaxially oriented intermediate layer 120, biaxially oriented buffer layer 130, and nucleation layer 140, as well as methods of forming intermediate layer 120, biaxially oriented buffer layer 130, and nucleation layer 140, have been described hereinabove.

The following example illustrates the advantages and features of the present invention, and is in no way intended to limit the invention thereto.

Example 1

The following sequence was used to deposit biaxially oriented magnesium oxide (MgO) buffer layers on IBAD-grown MgO intermediate layers, which in turn were deposited on Dupont Kapton® tapes.

Kapton® tape having a thickness of 2 mil was provided and cleaned with acetone, methanol, and isopropanol. A nucleation layer of yttria ($Y_2O_3$) was deposited on the Kapton® tape at room temperature (i.e., the Kapton® tape was not actively heated, nor did the temperature of the Kapton® tape substantially exceed room temperature) using electron beam evaporation. The nucleation layer was deposited at a rate of 0.15 nm/s and had a thickness of about 9 nm. A 10 nm thick MgO was then deposited at room temperature using IBAD to achieve biaxial texture. During MgO deposition, the substrate was not actively heated and did not substantially exceed room temperature. In the IBAD process an $Ar^+$ beam (40 mA/750 V with Ar gas flow of 10 sccm) was directed at the nucleation layer/Kapton® tape substrate at 45° to normal. The IBAD MgO deposition took place at a rate of about 0.2 nm/s. An MgO buffer layer having thicknesses in a range from about 50 nm to about 100 nm was then homoepitaxially deposited on the MgO intermediate layer using electron-beam evaporation. The MgO buffer layer was deposited at a rate of 0.1 nm/s and at about 300° C. under a pressure of about $5 \times 10^{-5}$ Torr of $O_2$. X-ray diffraction analysis shows that the MgO crystals in the intermediate and buffer layers grow with the (00l) orientation normal to the nucleation layer/Kapton® tape substrate. Out-of-plane and in-plane mosaic spreads of the MgO biaxially oriented crystals were below 3° and 6°, respectively, which are indicative of a high degree of crystalline order in the deposited film.

While typical embodiments have been set forth for the purpose of illustration, the foregoing description should not be deemed to be a limitation on the scope of the invention.

Accordingly, various modifications, adaptations, and alternatives may occur to one skilled in the art without departing from the spirit and scope of the present invention.

The invention claimed is:

1. A flexible template for a device, the flexible template comprising:
   a. a flexible polymeric substrate comprising a polyimide;
   b. a biaxially oriented intermediate layer disposed over the polymeric substrate; and
   c. a biaxially oriented buffer layer epitaxially grown on the intermediate layer: and
   d. at least one semiconducting active layer disposed over the biaxially oriented buffer layer further including a nucleation layer disposed between the polymeric substrate and the intermediate layer, wherein the nucleation layer has a thickness in a range from about 1 nm to about 50 nm.

2. The flexible template according to claim 1, wherein the nucleation layer is an oxide.

3. The flexible template according to claim 2, wherein the oxide is yttrium oxide.

4. The flexible template according to claim 1, wherein the intermediate layer comprises at least one of an oxide and a nitride.

5. The flexible template according to claim 4, wherein the oxide is a binary metal oxide having a cubic crystal structure.

6. The flexible template according to claim 5, wherein the binary metal oxide has a face-centered cubic-based crystal structure.

7. The flexible template according to claim 5, wherein the binary metal oxide is selected from the group consisting of magnesium oxide, calcium oxide, strontium oxide, barium oxide, titanium oxide, zirconium oxide, vanadium oxide, niobium oxide, tantalum oxide, chromium oxide, manganese oxide, iron oxide, cobalt oxide, nickel oxide, cadmium oxide, scandium oxide, lanthanum oxide, cerium oxide, neodymium oxide, samarium oxide, europium oxide, ytterbium oxide, and combinations thereof.

8. The flexible template according to claim 7, wherein the binary metal oxide is magnesium oxide.

9. The flexible template according to claim 4, wherein the nitride has a face-centered cubic-based crystal structure.

10. The flexible template according to claim 9, wherein the nitride is selected from the group consisting of strontium nitride, scandium nitride, yttrium nitride, titanium nitride, zirconium nitride, hafnium nitride, vanadium nitride, niobium nitride, tantalum nitride, chromium nitride, molybdenum nitride, tungsten nitride, lanthanum nitride, cerium nitride, praseodymium nitride, neodymium nitride, samarium nitride, europium nitride, gadolinium nitride, terbium nitride, dysprosium nitride, holmium nitride, erbium nitride, ytterbium nitride, lutetium nitride, thulium nitride, and combinations thereof.

11. The flexible template according to claim 10, wherein the nitride is titanium nitride.

12. The flexible template according to claim 1, wherein the intermediate layer has a thickness in a range from about 2 nm to about 50 nm.

13. The flexible template according to claim 1, wherein the buffer layer comprises at least one of an oxide and a nitride.

14. The flexible template according to claim 13, wherein the oxide is a binary metal oxide having a cubic crystal structure.

15. The flexible template according to claim 14, wherein the binary metal oxide is selected from the group consisting of magnesium oxide, calcium oxide, strontium oxide, barium oxide, titanium oxide, zirconium oxide, vanadium oxide, niobium oxide, tantalum oxide, chromium oxide, manganese oxide, iron oxide, cobalt oxide, nickel oxide, cadmium oxide, scandium oxide, lanthanum oxide, cerium oxide, neodymium oxide, samarium oxide, europium oxide, ytterbium oxide, and combinations thereof.

16. The flexible template according to claim 14, wherein the binary metal oxide having a face-centered cubic-based crystal structure.

17. The flexible template according to claim 16, wherein the binary metal oxide is magnesium oxide.

18. The flexible template according to claim 13, wherein the nitride has a face-centered cubic-based crystal structure.

19. The flexible template according to claim 18, wherein the nitride is selected from the group consisting of strontium nitride, scandium nitride, yttrium nitride, titanium nitride, zirconium nitride, hafnium nitride, vanadium nitride, niobium nitride, tantalum nitride, chromium nitride, molybdenum nitride, tungsten nitride, lanthanum nitride, cerium nitride, praseodymium nitride, neodymium nitride, samarium nitride, europium nitride, gadolinium nitride, terbium nitride, dysprosium nitride, holmium nitride, erbium nitride, ytterbium nitride, lutetium nitride, thulium nitride, and combinations thereof.

20. The flexible template according to claim 19, wherein the nitride is titanium nitride.

21. The flexible template according to claim 1, wherein the buffer layer has a thickness in a range from about 50 nm to about 500 nm.

22. The flexible template according to claim 1, wherein the buffer layer is homoepitaxially deposited on the intermediate layer.

23. The flexible template according to claim 1, wherein the flexible template forms a portion of one of a photovoltaic cell, a LED, and a transistor.

24. A flexible template, the flexible template comprising:
   a. a flexible polyimide substrate;
   b. a nucleation layer disposed on a surface of the polyimide substrate, wherein the nucleation layer comprises $Y_2O_3$;
   c. a biaxially oriented intermediate layer disposed on the nucleation layer, wherein the intermediate layer is deposited by ion beam assisted deposition and has a face-centered cubic-based crystal structure, and wherein the intermediate layer is one of a nitride and an oxide; and
   d. a biaxially oriented buffer layer epitaxially grown on the intermediate layer.

* * * * *

UNITED STATES PATENT AND TRADEMARK OFFICE
CERTIFICATE OF CORRECTION

PATENT NO. : 7,601,430 B2
APPLICATION NO. : 11/345106
DATED : October 13, 2009
INVENTOR(S) : Alp T. Findikoglu and Vladimir Matias It is certified that error appears in the above-identified patent and that said Letters Patent is hereby corrected as shown below:

Title page, item [75] inventor, the first named Inventor should read:
"Alp T. Findikoglu".

Signed and Sealed this

Twenty-second Day of December, 2009

David J. Kappos
*Director of the United States Patent and Trademark Office*